United States Patent [19]

Stirk

[11] 4,320,434
[45] Mar. 16, 1982

[54] POWER SEMICONDUCTOR PROTECTION CIRCUIT WITH FAULT DETECTION

[75] Inventor: Gary L. Stirk, Rocky Mount, Va.

[73] Assignee: General Electric Company, Salem, Va.

[21] Appl. No.: 101,783

[22] Filed: Dec. 10, 1979

[51] Int. Cl.³ .......................... H02H 7/20; H02H 3/28
[52] U.S. Cl. ......................................... 361/86; 361/88
[58] Field of Search ................... 361/86, 88, 89, 90, 361/93, 98; 330/298, 207 P

[56] References Cited

U.S. PATENT DOCUMENTS

| | | | |
|---|---|---|---|
| 3,534,249 | 10/1970 | Neill et al. ................... | 361/98 X |
| 3,678,291 | 7/1972 | Coe ............................. | 361/98 |
| 3,761,775 | 9/1973 | Ozawa et al. ............... | 361/86 |
| 3,764,883 | 10/1973 | Staad et al. ................. | 361/86 X |
| 3,931,547 | 1/1976 | Glogolja ..................... | 361/86 |
| 3,932,789 | 1/1976 | Sons et al. . | |
| 3,988,695 | 10/1976 | Mattfeld et al. ............ | 330/207 P |
| 4,127,887 | 11/1978 | Tanaka et al. .............. | 361/86 |
| 4,150,413 | 4/1979 | Nerem ........................ | 361/86 |

*Primary Examiner*—Patrick R. Salce
*Attorney, Agent, or Firm*—Arnold E. Renner; James H. Beusse

[57] ABSTRACT

A protection and fault detection circuit for an electrically isolated semiconductor power driver acting as a switch to connect a load such as a relay coil to a source of voltage employs logic circuitry responsive to input signals indicative, respectively, of the desired state of driver operation and the conductive condition of the driver itself to effect a rendering of the device to the nonconducting state when an overload or other fault condition exists. A monitoring circuit responsive to specified operating parameters of the semiconductor power driver and its associated circuitry provides an output fault signal which is indicative of a fault condition and may be employed for remedial and/or indicating purposes.

4 Claims, 1 Drawing Figure

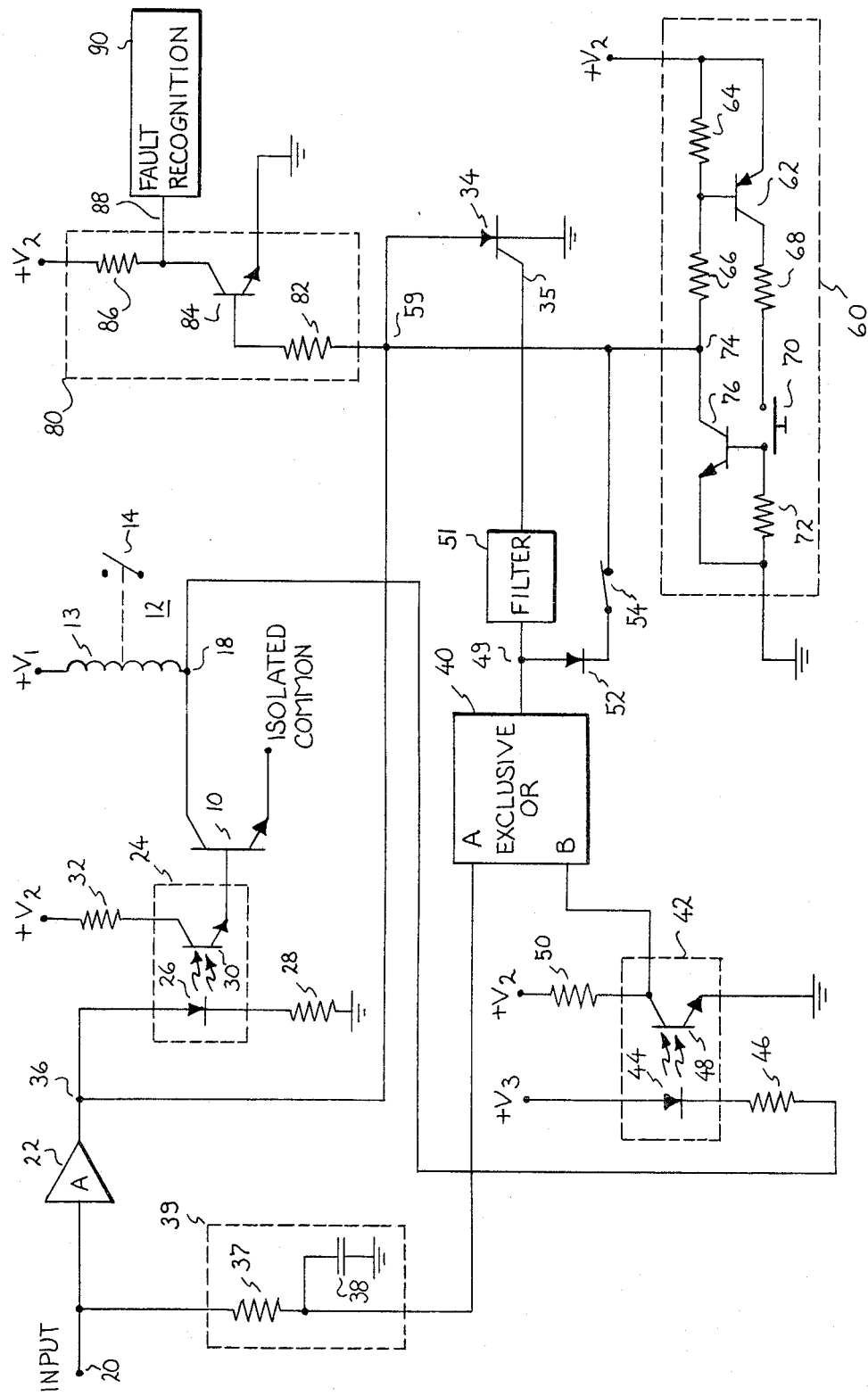

POWER SEMICONDUCTOR PROTECTION CIRCUIT WITH FAULT DETECTION

BACKGROUND OF THE INVENTION

The present invention relates generally to protection and fault detection schemes and more particularly to rapid response protection and detection circuits for semiconductor power drivers.

Power semiconductors such as transistors are now commonly used as switches or drivers to supply electrical power to other operational devices such as d.c. contactors, lamps and relays. A very prevelant problem, however, exists with respect to the protection of the semiconductor device itself from overload currents which would be of a magnitude sufficient to destroy the device and to providing a reliable indication of a fault condition at a reasonable cost.

Fuses are one commonly used form of circuit protection and are often employed in semiconductor (including transistor) drive circuits such as discussed above. Fuses, however, are relatively slow reacting devices (e.g., in the 1 to 10 millisecond time range) while semiconductor devices can be destroyed by overload conditions in as little as one-tenth the reaction time of the fuse. Thus, while a fuse may serve to protect the circuit wiring, etc., its use as a sole protective device will usually permit the destruction of the semiconductor driver.

Another form of semiconductor protection sometimes used is that of sensing the load current carried by the semiconductor device and shutting the device off in the event of an overcurrent. While this form of protection can usually provide sufficiently rapid protection, accurate d.c. current sensing is a very difficult and often expensive function and, in situations such as lamp loads where there is a large inrush current, may also give misleading results.

SUMMARY OF THE INVENTION

It is, therefore, an object of the present invention to provide an improved protection scheme for a semiconductor device.

A further object is to provide fast-acting protection for a power transistor driver which permits electrical isolation of that driver.

An additional object is to provide an improved scheme for indicating the existence of a fault condition with respect to a semiconductor device and its associated control circuitry.

Another object is to provide protective circuitry for a power transistor driver which protects against faults which could lead to the destruction of the transistor.

A still further object is to provide a fast acting protective circuit for a power transistor which further includes reset circuitry effective to reset the power circuitry only if a fault has actually occurred and which further permits resetting without the necessity of disturbing operating cycles.

Still another object is to provide a fast acting protection scheme for a semiconductor which is completely compatible for use with additional protection schemes such as fuses, sensing of d.c. current, etc.

The foregoing and other objects are satisfied in accordance with the present invention through the provision of a protective circuit for a semiconductor device responsive to an input signal to connect a load to a source of electrical potential. In the present invention, the input signal, properly conditioned, serves to render the semiconductor device conductive to thereby effect the load to source connection. Circuitry responsive to a voltage associated with the semiconductor device develops a condition signal which has a first value when the device is conducting normally and a second value at all other times including the case of overload. Logic circuitry responsive to a prescribed relationship between the input signal andd the condition signal is effective to generate a control signal which, in turn, serves as the effective signal to render operative an additional switching means which in turn, when operative, serves to render the semiconductor device nonconductive.

In the total preferred embodiment, the present invention further includes a reset circuit which is operable, after the occurrence of a fault condition, to reset the protective circuitry but which is ineffective at all other times.

An additional feature of the present invention relates to reliable and inexpensive detection circuitry for providing an output signal which is indicative of a fault condition and which can be used for indicative and/or remedial purposes. This circuitry is responsive to a circuit operating parameter, such as a voltage level, to effect the output signal.

BRIEF DESCRIPTION OF THE DRAWING

While the present invention is particularly defined in the claims annexed to and forming a part of this specification, a better understanding can be had from the following description taken in conjunction with the single FIGURE of the accompanying drawing which is a schematic diagram illustrating the present invention in its preferred embodiment.

DETAILED DESCRIPTION

Referencing now the single FIGURE of the drawing, there is shown a semiconductor device 10, illustrated as a power transistor, the protection of which is the subject of the present invention. As illustrated, the emitter of the transistor 10 is connected to an isolated common reference voltage (e.g., zero volts) while its collector is connected by way of junction 18 and a load 12 to a source of positive potential designated $+V_1$. In the illustrated embodiment, the load 12 is a relay having an inductive coil 13 which, when supplied with sufficient current, serves to operate a suitable contact 14 all as is known in the relay art. Transistor 10 will become conductive with the application of a suitable positive signal to its base electrode. In FIG. 1, this signal is illustrated as being initiated at an input terminal 20 to which an input signal indicating a desire of the operation of the relay 12 is applied by some external means. The signal at terminal 20 is supplied to an amplifier 22 which properly scales the input signal and provides a signal of proper magnitude at its output, junction 36. This scaled signal at junction 36 is first applied to a suitable optical isolation means shown as a photoisolator 24 which may be of any of those known in the art (e.g., a Model 4N32 photoisolator by General Electric Company). The illustrated photoisolator includes a photodiode 26, such as a light emitting diode, having its anode connected to junction 36 and its cathode connected, through a suitable external resistor 28, to ground. Also included within the isolator 24 is a phototransistor 30 having its collector connected by way of a scaling resistor 32 to a source of positive potential $+V_2$ and its emitter serving as the input to the base of the transistor 10. As is known in the art, the application of an input signal of proper magnitude at terminal 20 will result in the conduction of the photoisolator 24 rendering the transistor 10 conductive and thus operating the relay 12.

The output of amplifier 22, i.e., junction 36, is further connected by a suitable conductor to a switch means which in the present embodiment is shown as a controlled rectifier or thyristor 34. The cathode of this thyristor is connected to ground and it is seen that when this switch is rendered conductive, point 36 will be essentially pulled to ground, reducing the output of isolator 24 to thereby remove the base bias from the transistor 10 rendering that transistor nonconductive. Thus, it is seen that by properly gating the thyristor 34 protection of the transistor 10 can be achieved.

Thyristor 34 will conduct when there exists a positive voltage between its anode and cathode and the simultaneous application of a control signal by way of line 35 to its gate electrode. Still referencing the drawing, it is seen that the signal at input 20 is applied by way of a filter 39, comprised of a series resistor and a ground connected capacitor 38, to an "A" input of a logic circuit 40 which provides an "Exclusive OR" function. The second or "B" input of the logic circuit 40 is connected to the output of a second photoisolator 42 which may be the same type as that described earlier. In this case, the isolator includes a photodiode 44 which has its anode connected to a suitable potential source such as the $+V_3$ source and its cathode connected by way of a resistor 46 to the collector of the transistor 10 (junction 18). Source $+V_3$ is preferably of a lower value than $+V_1$ to permit the second photoisolator 42 to respond to a relatively small change in voltage at junction 18. The positive $+V_2$ potential is connected by way of resistor 50 to the collector of a phototransistor 48, within the isolator 42, which transistor has its emitter connected to ground. The collector of the transistor 48, i.e., the output of the isolator 42, serves as the B input to the Exclusive OR gate 40. In accordance with the illustrated embodiment, when transistor 10 is conducting normally, junction 18 will be at substantially the isolated common voltage (e.g., zero volts) causing the diode 44 to conduct heavily to thus render transistor 48 conductive. This, in turn, causes the output of the isolator 42 and hence the B input to gate 40 to be at a low voltage level. When transistor 10 is not conducting, junction 18 will be, essentially, at $+V_1$ voltage, diode 44 and hence transistor 48 will be at low conduction levels (or off) and the output of isolator 42 will approach $+V_2$ voltage. A similar situation exists when transistor 10 is overloaded to the point where danger of damage to that transistor is present. As is well known, when a transistor is overloaded, it will pull out of saturation and the collector voltage will rise appreciably. As such, it is seen that when transistor 10 is conducting properly, the B input to gate 40 will be at substantially zero volts while at all other times this input will be at some higher level. Thus, this input to gate 40 may be termed a "condition signal" since its value is dependent upon the conduction condition of transistor 10.

The output of the Exclusive OR logic circuit 40 appears at junction 49 and serves as the input to a filter 51, the output of which is a control signal on line 35. Filter 51 insures that transients and very small pulses which are inherently present in the circuitry of the present invention, as will be discussed, will not be sufficiently passed on line 35 to the thyristor 34 to enable that thyristor to the conductive state.

From the description so far, it is seen that under normal operating conditions, with the application of a positive input signal at terminal 20, transistor 10 will be rendered conductive and the collector of that device will go to a low voltage value. The input signal at terminal 20 is also applied by way of the filter circuit 39 to the A input of the Exclusive OR gate 40 which will pass this signal since it is the only signal applied. However, a short period of time after the application of the input signal to the A input of Exclusive OR gate 40, because the transistor 10 has begun to conduct, the condition signal from the photoisolator 42 will occur and be applied to the B terminal of gate 40 to thus disable that gate. It is possible that a very short, narrow pulse will be passed by the Exclusive OR gate 40 to junction 49 during the time between the first occurrence of the input at terminal 20 and the appearance of the condition signal. Because of filter 51, however, the signal passed on line 35 will be insufficient to render thyristor 34 conductive.

If, however, a fault condition such as an overload current whih is sufficient to pull the transistor 10 out of conduction exists, the voltage at its collector and, hence, at terminal 18 will rise. This rise in voltage will reduce the conduction of current through the photodiode 44 and effect a change in the condition of the output of the photoisolator 42, i.e., the condition signal, which is applied as the B input to the Exclusive OR gate 40. Since the input signal requesting conduction remains present at the A input to the Exclusive OR gate 40, the output of gate 40 will change and will provide a positive output signal at junction 49. This signal will pass through the filter 51 and will in this case be sufficient to apply a signal of sufficient magnitude, via line 35, to the thyristor 34 to render that thyristor conductive. When thyristor 34 conducts, the voltage at terminal 36 is reduced to essentially ground potential which will in turn decrease the output of the photoisolator 24 thus removing the bias from the base of transistor 10 turning it off. This action all occurs within sufficient time to prevent catastrophic damage of the transistor 10.

By similar rationale, it is seen that if transistor 10 fails to conduct for some reason and its collector voltage remains high even though a signal is present at input 20, thyristor 34 will be rendered conductive. A third fault possibility is that for some reason the transistor 10 continues to conduct even though the input at terminal 20 is removed. As in the previous cases, this condition will again cause the A and B inputs to the Exclusive OR gate 40 to be different passing an output signal to effect conduction of thyristor 34. Thus, only when transistor 10 conducts properly is thyristor 34 not gated into conduction.

Once a fault has occurred, it is, of course, necessary to have some means to reset the circuit for subsequent operation. In accordance with the preferred embodiment, reset circuitry 60 is connected to the anode of thyristor 34 (junction 59). The circuitry 60 includes a first transistor 62 having its emitter connected to the source of positive potential $+V_2$ which is also connected by way of a suitable resistor 64 to the base of that transistor. The collector of transistor 62 is connected by way of resistor 68 to one contact of a reset switch shown as a pushbutton 70. The base of transistor 62 is further connected by way of resistor 66 to a junction 74 which is connected to junction 59. Junction 74 is further connected to the collector of a second transistor 76, the emitter of which is connected to ground. The base of transistor 76 is connected to the second contact of the pushbutton switch 70 which is further connected by way of resistor 72 to ground. In operation, it is seen that when thyristor 34 is not conducting, the voltage at junction 59 is high enough to prevent transistor 62 from conducting. In this situation, operation of the pushbutton 70 will have no affect upon circuit operation. When, however, the voltage at junction 59 drops as will be the case when the thyristor 34 begins to conduct, transistor 62 will be rendered conductive. With the operation of the pushbutton 70, connecting the base of transistor 76 to the positive potential source $+V_2$, transistor 76 will conduct to thus, essentially, connect point 59 to ground thereby reducing thyristor anode voltage and turning the thyristor off.

In order that the circuitry may be reset without requiring removal of the input signal at terminal 20, the output of the Exclusive OR gate 40 (junction 49) is connected by way of a diode 52 and a normally closed switch 54 to junction 74. With switch 54 in the closed position, when transistor 76 conducts, junction 49 will also be pulled to ground potential to thus remove the gating signal from thyristor 34. In this situation, even though the input signal at terminal 20 remains at a high voltage level, which in turn places a positive potential on the anode of the thyristor 34, the removal of the gate signal at the time when that thyristor is turned off will prevent it from beginning conduction immediately upon the release of the pushbutton 70 and the ceasing of conduction of transistor 76. Switch 54 is included as an option and permits, when that switch is opened, the requirement that the operator force a nonconductive indicating input at terminal 20 in order to reset the circuitry. With switch 54 open, so long as the input signal at terminal 20 is of a state to effect conduction of transistor 10, the thyristor 34 will begin conduction as soon as the pushbutton 70 is released.

The final depiction in the FIGURE illustrates an additional feature of the present invention. Shown connected to junction 59 is a voltage level detector 80 which may be of any appropriate type but which is illustrated as a simple transistor switch. As depicted, the detector 80 includes a transistor 84 which has its base connected to junction 59 via resistor 82. The transistor emitter is connected to ground while the collector is connected to a suitable source of potential such as $+V_2$. An output line 88 is connected to the collector of transistor 84 and serves to deliver an output signal to any appropriate fault recognition circuitry represented by block 90. The nature of circuitry in block 90 is not material to the present invention but may be, for examples, an audio or visual alarm or circuit means to provide a corrective function such as removing any input signal at terminal 20.

As to the operation of the detection aspect of the present invention, it will be remembered from the earlier description that junction 59 will be at a high potential at all times excepting when a fault condition of some kind is present. When such a fault condition is present and thyristor 34 is conducting, junction 59 will be at a low potential, approaching ground. Thus, when no fault is present, transistor 84 will be conducting to hold line 88 at essentially ground potential. When, however, a fault occurs and the potential at junction 59 falls, transistor 84 will cease to conduct and the collector voltage of that transistor will rise providing the output signal on line 88.

While there has been shown and described what is at present considered to be the preferred embodiment of the present invention, modifications thereto will readily occur to those skilled in the art. It is not desired, therefore, that the invention be limited to this specific arrangement shown and described and it is intended to cover in the appended claims all such modifications as fall within the true spirit and scope of the invention.

What is claimed is:

1. A protective circuit for a power semiconductor device responsive to an input signal to connect a load to a voltage source comprising:
   (a) first means responsive to said input signal for effecting a signal operable to render said semiconductor device conductive to thereby connect said load to said voltage source;
   (b) second means responsive to a voltage associated with said semiconductor device to develop a condition signal having a first value when said semiconductor device is conducting normally and a second value at all other times;
   (c) logic means responsive to a prescribed relationship between said input signal and said condition signal to generate a control signal;
   (d) switch means including a gate controlled semiconductor device having an anode, a cathode and a gate electrode responsive to said control signal operative to render said semiconductor device nonconductive; and,
   (e) reset circuit means operable to reduce the voltage on said gate controlled semiconductor device anode to a level sufficient to render said device nonconductive, said reset circuit means including first and second semiconductor switching means,
      (1) said first semiconductor switching means normally being biased to the nonconductive state by the voltage on the gate controlled semiconductor device when said gate controlled semiconductor device is nonconductive and being biased to a conductive state when said gate controlled semiconductor device is conductive;
      (2) said second semiconductor switching means capable of being rendered conductive to reduce the voltage on the anode of said gate controlled semiconductor device to thereby render that device nonconductive; and,
      (3) switch means selectively operable to effect the conduction of said second semiconductor switching means.

2. The invention in accordance with claim 1 wherein said first and second semiconductor switching means each comprises a transistor.

3. The invention in accordance with claim 1 wherein said last recited switching means comprises a manually operable switch.

4. The invention in accordance with claim 1 further including means connecting said control signal to said second semiconductor switching means whereby said control signal is reduced in value to a level ineffective to enable said gate controlled semiconductor device.

* * * * *